United States Patent
Gao

(10) Patent No.: US 8,559,140 B2
(45) Date of Patent: Oct. 15, 2013

(54) MAGNETIC ELEMENT WITH VARYING STRIPE HEIGHTS

(75) Inventor: Kaizhong Gao, Eden Prairie, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 121 days.

(21) Appl. No.: 13/094,495

(22) Filed: Apr. 26, 2011

(65) Prior Publication Data

US 2012/0275062 A1 Nov. 1, 2012

(51) Int. Cl.
*G11B 5/39* (2006.01)

(52) U.S. Cl.
USPC ........................... 360/324.12; 360/319

(58) Field of Classification Search
USPC .............................. 360/319, 324.12
See application file for complete search history.

(56) References Cited

U.S. PATENT DOCUMENTS

| 5,737,155 | A | * | 4/1998 | George et al. ............. 360/322 |
| 5,748,415 | A | * | 5/1998 | Christner et al. ......... 360/327 |
| 5,978,184 | A | | 11/1999 | Terunuma |
| 6,433,973 | B1 | | 8/2002 | Li et al. |
| 6,735,062 | B1 | | 5/2004 | Pokhill et al. |
| 7,075,761 | B2 | | 7/2006 | Parker |

* cited by examiner

*Primary Examiner* — Craig A. Renner
(74) *Attorney, Agent, or Firm* — Hall Estill Attorneys at Law

(57) ABSTRACT

A magnetically responsive magnetic stack with a first stripe height is positioned laterally adjacent first and second side stacks that respectively extend a second and third distance from an air bearing surface (ABS). The second distance is greater than the third distance capable of biasing the magnetic stack to a predetermined magnetization.

19 Claims, 5 Drawing Sheets

MAGNETIC ELEMENT WITH VARYING STRIPE HEIGHTS

SUMMARY

Various embodiments of the present invention are generally directed to a magnetic element capable of enhanced magnetic reading.

In accordance with various embodiments, a magnetically responsive magnetic stack with a first stripe height distance from an air bearing surface (ABS) is positioned laterally adjacent first and second side stacks that respectively extend second and third stripe height distances from the ABS. The second stripe height distance is greater than the third stripe height distance capable of biasing the magnetic stack to a predetermined magnetization.

DETAILED DESCRIPTION

The present disclosure generally relates to magnetic elements capable of reading programmed data bits from an adjacent data media, such as in the context of read elements used in data transducing heads. As demand for higher data capacity in electronic devices increases, added emphasis is placed on the size of data bits written to the data storage media. To read smaller data bits and achieve higher data capacity, magnetic element dimensions are reduced and reading performance can be affected. Thus, with more bits being fit in a given area on a storage media, the ability for a magnetic writing element to precisely read data bits plays an increasingly important role.

Accordingly, a magnetically responsive magnetic stack with a first stripe height distance from an air bearing surface (ABS) can be positioned laterally adjacent to first and second side stacks that respectively extend second and third stripe height distances from the ABS. By constructing the second stripe height distance to be greater than the third stripe height distance, the magnetic stack can be biased to a predetermined magnetization. Varying the stripe heights of the magnetic and side stacks can tune and control the predetermined magnetization to accommodate various operational environments. The ability to read data bits from a small area of the media can lead to increased data density with enhanced performance through increased reader linearity and decreased magnetic asymmetry.

Figure 1:
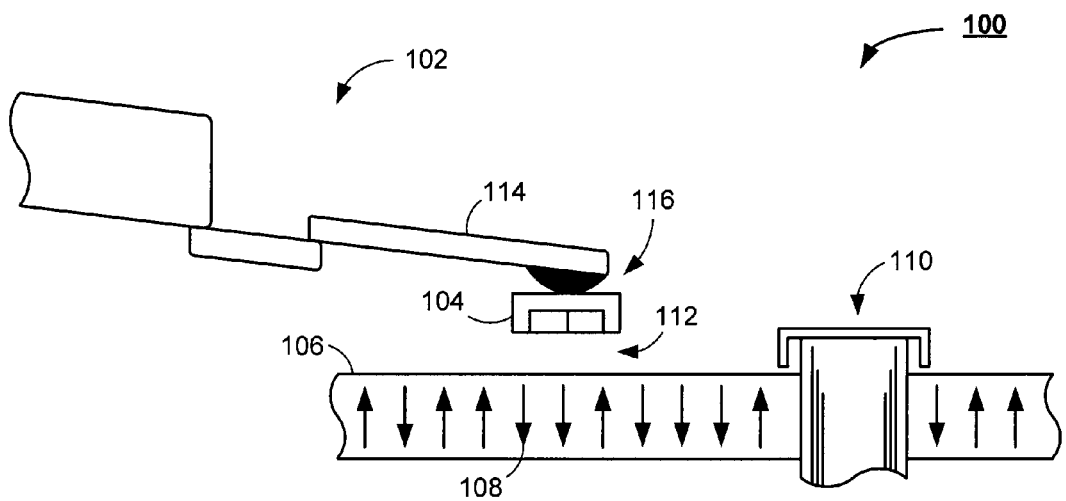
FIG. 1 is a block representation of an example portion of a data storage device.

Although a magnetically responsive magnetic stack can be constructed in a variety of non-limited environments, an embodiment of a data transducing portion 100 of a data storage device is provided in FIG. 1. The transducing portion 100 has an actuating assembly 102 that positions a transducing head 104 over a magnetic storage media 106 that is capable of storing programmed bits 108. The storage media 106 is attached to a spindle motor 110 that rotates during use to produce an air bearing surface (ABS) 112 on which a slider portion 114 of the actuating assembly 102 flies to position a head gimbal assembly (HGA) 116, which includes the transducing head 104, over a predetermined portion of the media 106.

The transducing head 104 can include one or more transducing elements, such as a magnetic writer and magnetically responsive reader, which operate to program and read data from the storage media 106, respectively. In this way, controlled motion of the actuating assembly 102 causes the transducers to align with tracks (not shown) defined on the storage media surfaces to write, read, and rewrite data.

It is to be understood that within the confines of this disclosure, "stripe height" is a dimensional distance parameter measured orthogonal from a corresponding data media and ABS. As such, a stripe height of a layer, or lamination of layers, of a magnetic element refers to the distance a layer continuously extends from the ABS. Hence, a greater stripe height indicates that a layer extends farther away from the ABS than a layer with a lesser stripe height.

It is further to be understood that the term "stack" is an unlimited term within this disclosure that can be one layer, or a lamination of layers, of material. As such, a "stack" can be configured into any shape and size to provide shielding and biasing characteristics to an adjacent magnetic read element. Throughout the present application, the term "stack" will be understood to mean a component that is constructed with any material that can be used in any operational function. For example, but not in any way limiting, a magnetic stack may be a lamination of layers that respond to external magnetic flux, while a side stack may be a single permanent magnet that provides magnetic shielding.

Figure 2A:
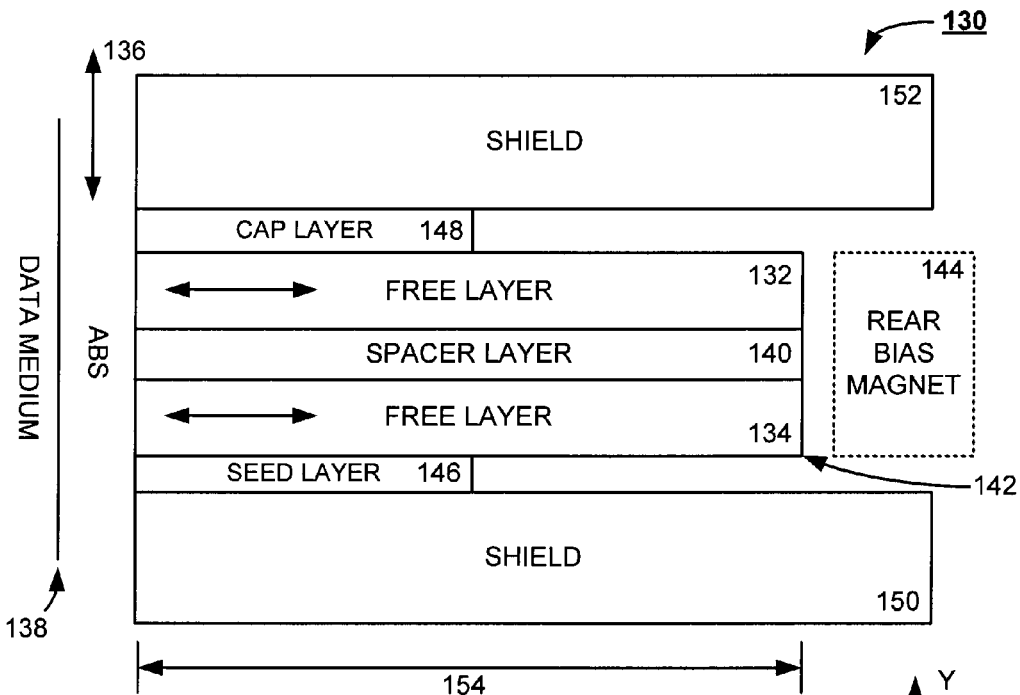
FIGS. 2A-2C generally illustrate an embodiment of a magnetic element capable of being used in the portion of the data storage device displayed in FIG. 1.

FIG. 2A displays a cross-section view of a block representation of an embodiment of a magnetic element 130 capable of being used in the device 100 of FIG. 1. The element 130 has first and second ferromagnetic free layers 132 and 134 that are each sensitive to external magnetic fields. That is, each free layer 132 and 134 will respond to an encountered external magnetic field, such as programmed magnetic bits on data tracks 136 of a data storage medium 138 that is separated from the free layers 132 and 134 by an ABS. The relative angle between free layer 132 and 134 will be different for media fields pointing into or out of the ABS, as measured along the X axis, which will translate to low or high resistance/voltage state. By doing so, binary information stored in media is recovered.

The free layers 132 and 134 are each contactingly adjacent a non-magnetic spacer layer 140 that acts to provide a measureable magnetoresistive effect between layers 132 and 134. While the spacer 140 can be constructed of any non-magnetic material with a predetermined thickness, a variety of different non-limiting configurations can be used to accommodate varying free layer magnetic interactions and data bit sensing. The coupled lamination of the free layers 132 and 134 to the spacer layer 140 can be characterized as a magnetic stack 142 that is influenced, in some embodiments, by a rear mounted permanent magnet 144 that imparts a predetermined magnetic biasing field on the free layers 132 and 134 to set a default magnetization.

The magnetic stack 142 can further be constructed where each of the free layers 132 and 134 are additionally coupled to a respective electrode layer, such as seed layer 146 and cap layer 148 that provide appropriate growth template (seed) or protection (cap) during sensor definition process. It is contemplated, however, that the magnetic element 130 is constructed without the electrode layers while in other embodiments the composition, shape, and placement of the electrode layers 146 and 148 are modified, as needed, to provide performance and manufacturing benefits, such as enlarging the width or length one, or both, layers 146 and 148.

While encountering the data bits of the data storage medium 138 along a particular data track 136, data bits from adjacent tracks can inadvertently be sensed by the magnetic stack 142. At least one shield layer can therefore be attached to each of the electrode layers 148 and 150 on opposite sides of the free layers 132 and 134 to reduce or eliminate such inadvertent data bit sensing. The shield layers 150 and 152 can be oriented in a variety of formations and compositions, none of which are required or limited, to direct unwanted magnetic flux away from the free layers 132 and 134.

The shielding of the magnetic stack 142 can be supplemented with other shield layers, such as side shields, that may or may not provide bias fields to the magnetic stack 142. The side shields may further combine with shield layers 150 and 152 to allow for improved magnetic sensing of programmed data bits from the preset data tracks 136 in the storage medium 138 by eliminating noise and inadvertent sensing of adjacent bits. The size and number of shielding and biasing layers can influence the magnetization strength needed to reliably operate the magnetic stack 142, particularly in high linear data bit density recordings.

Magnetic stability of the stack 142 can be increased with the elongation of the stack's stripe height 154, as measured along the X axis. The extended stripe height 154 can enhance robustness against process variability and external disturbances while providing heightened magnetization strength through anisotropic interactions between the layers. However, the elongated stripe height 154 can lead to high magnetic asymmetry when the stack 142 encounters data bits due to magnetic asymmetry being a product of a reduced scissoring angle between the magnetizations of the free layers 132 and 134 in a quiescent state.

Figure 2B:
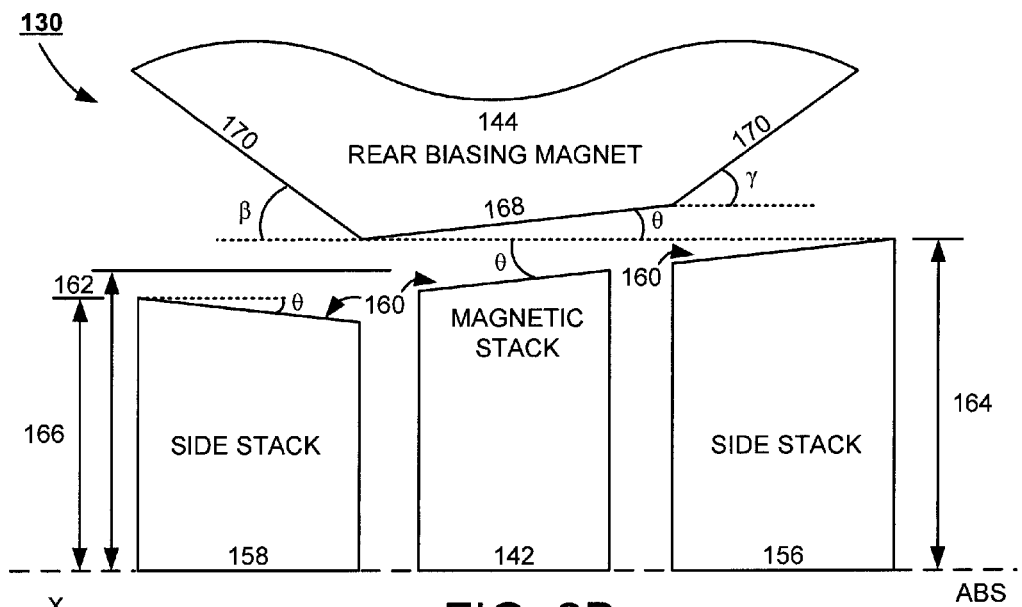

In FIG. 2B, the magnetic stack 142 is laterally disposed between first and second side stacks 156 and 158 that each produces a biasing magnetization that alters the free layer 132 and 134 magnetizations. As shown, the magnetic stack 142 and side shields 156 and 158 are each configured with tapered rear surface features 160 that generally form individual trapezoidal shapes and share a predetermined non-parallel angularity (θ) compared to the ABS and Y axis.

The angularity of the rear surface features 160 result in the magnetic and side stacks 142, 156, and 158 having stripe heights that vary laterally across the entire reading portion 130 and for each rear surface feature, as viewed along the ABS and Y axis. That is, the magnetic and side stacks 142, 156, and 158 each do not have a uniform stripe height, but instead have laterally varying stripe heights that reduce the stripe heights from one lateral side to another.

By tapering the rear surface features 160 at a common angle, manufacturing of the reading portion 130 can be done simultaneously with a single material removal process, such as milling, etching, and lapping. Such simple manufacturing allows for educed fabrication variability with added ability to tune the performance of the magnetic stack 142 through adjustment of the stripe heights and angle of the taper. For example, the stripe height 162 of the magnetic stack 142, as measured at the longest distance from the ABS, can be adjusted to be less than the stripe heights 164 and 166 of the first and second side stacks 156 and 158, respectively.

The angular configuration of the reading portion 130 can further include constructing the rear biasing magnet 144 with one or more tapered surfaces, with respect to the ABS and Y axis. In the embodiment displayed in FIG. 2B, the rear biasing magnet 144 has a front surface 168 that faces the rear surface feature 160 of the magnetic stack 142 with the same common angle (θ). The rear biasing magnet 144 also has first and second sidewall surfaces 170 that are respectively tapered at different angles (β) and (γ), respectively. The orientation of the second side stack 158 can be flipped, as shown, so that the lateral tapering rear surface feature 160 tilts towards the magnetic stack 142 and the side stack's stripe height 166 decreases moving along the ABS towards the magnetic stack 142.

The unlimited ability to configure both the side stacks 156 and 158 as well as the rear biasing magnet 144 in a multitude of different configurations allows for precise tuning of the magnetic performance of the magnetic stack 142 with simple manufacturing processes. The variety of rear surface features further allows the side stacks 156 and 158 to have common or dissimilar configurations to provide optimized performance. However, the capabilities of modification of the rear surface features 160 do not end with varying the stripe heights, as generally displayed in FIG. 2C.

The isometric view of the reading portion 130 maintains the orientation of the magnetic and side stacks 142, 156, and 158, but provides a square rear surface feature 172 where the respective stripe heights 162, 164, and 166 remain uniform across and have a common angle that is parallel to the ABS and Y axis. The rear biasing magnet 144 is also modified from FIG. 2B in that the sidewall surfaces are oriented orthogonal to the ABS. That is, the rear biasing magnet 144 extends laterally across the extent of the reading portion 130 with a front surface 168 angled with respect to the ABS and sidewall surfaces 170 that are normal to the ABS, which further illustrates the vast possible configurations of the reading portion 130 to accommodate a wide variety of operating criteria.

Accordingly, various embodiments of the present invention improve magnetic asymmetry by providing the ability to tune and control the magnetizations of the magnetic stack 142 with bias fields set to produce enhanced performance. More specifically, one or more side stacks can be configured in a variety of shapes and stripe heights to induce varying bias magnetizations in the free layers 132 and 134 that can accommodate various operating parameters while reducing magnetic asymmetry and noise, especially in high data bit density recordings.

Figure 3:
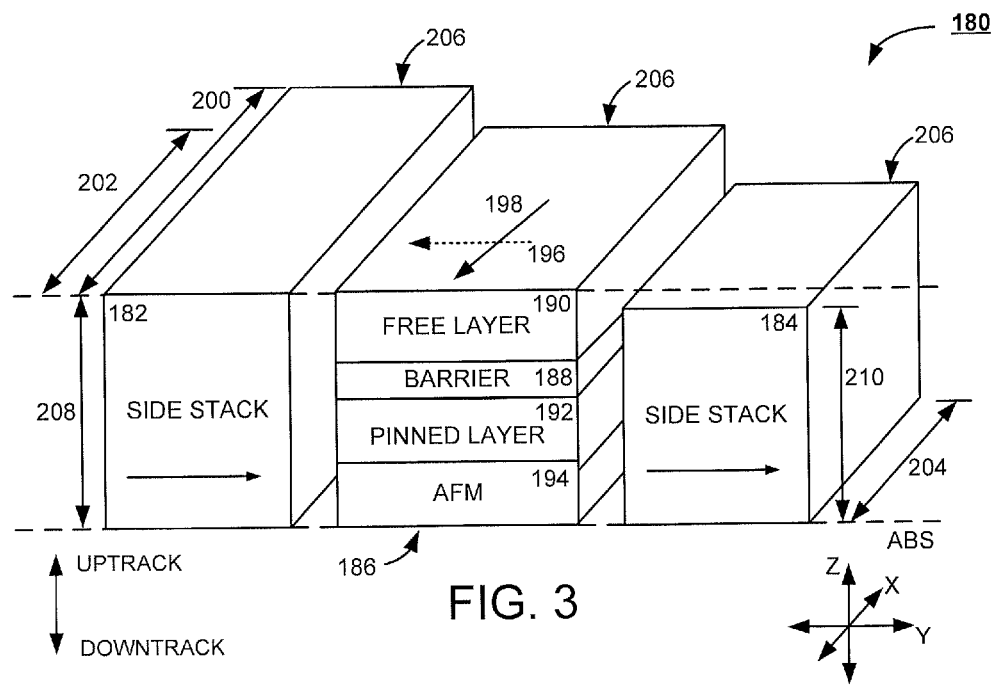
FIG. 3 shows an isometric view of a reading portion of an embodiment of a magnetic element as viewed from the air bearing surface (ABS).

FIG. 3 generally illustrates an isometric view of an example of a reading portion of a magnetic sensing element 180 as viewed from the ABS. It is to be understood that FIG. 3 is generally illustrated as aligned with a predetermined data track and side stacks 182 and 184 each shield the magnetic stack 186 from unwanted magnetic fields and bias the stack 186 with a predetermined bias magnetization.

As a general illustration of the unlimited possible configurations of a magnetic reading element employing the various embodiments of the present invention, the magnetic stack 186 is constructed with a tunneling barrier 188 disposed between a ferromagnetic free layer 190 and a ferromagnetic pinned layer 192 pinned to a set magnetization by an antiferromagnet (AFM) 194. The magnetic stack 186 has, as a result of the free and pinned ferromagnetic layers 190 and 192, respective independent magnetizations 196 and 198 in which the free layer magnetization 196 responds to programmed data bits to allow the sensing of binary data based on the difference between the magnetizations 196 and 198.

One or more of the side stacks 182 and 184 that are positioned laterally adjacent (cross-track) from the magnetic stack 186 can have varying stripe heights (distance from ABS) that enable precise control of the magnetic bias magnetization imparted on the stack 186. As shown, the first side stack 182 has a stripe height 200 that is greater than both the stripe heights 202 and 204 of the magnetic stack 186 and the second side stack 184. The change in stripe heights between the side stacks 182 and 184 and the magnetic stack 186 causes the stack layer magnetizations 196 and 198 to tilt towards the longer side shield 182. It has been observed that tilting the magnetizations 196 and 198 of the stack 186 can more accurately sense data bits in high density recordings due in part to a reduction in magnetic noise and asymmetry.

Figure 2C:
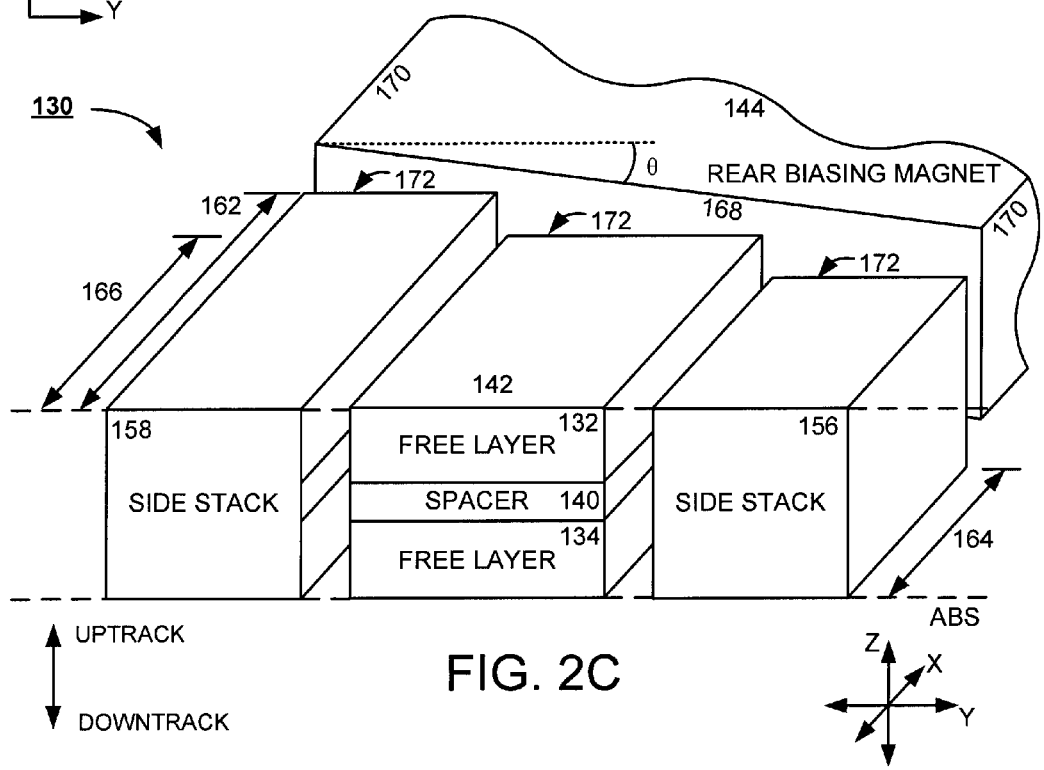

Attention should be brought to the fact that the side and magnetic stacks each have a uniform thickness, as measured along the Z axis, and square rear surface features 206 (distal and opposite to the ABS) where the stripe heights 200, 202, and 204 are continuous with respective uniform stripe heights that remain parallel to the ABS (Y axis) along the entire rear surface of the magnetic and side stacks 182, 184, and 186, similarly to rear surface features 172 of FIG. 2C.

While the magnetic and side stacks 182, 184, and 186 can be adjusted to varying stripe heights and rear surface feature 206 shapes, the thickness of one or more of the stacks 182, 184, and 186 can also be modified at will. The first side stack and magnetic stack are shown in FIG. 3 with a first thickness 208, as measured along the Z axis, which is greater than the second thickness 210 of the second side stack 184. Such thickness adjustment can further tune the magnetic stack's magnetizations 196 and 198.

Figure 4:
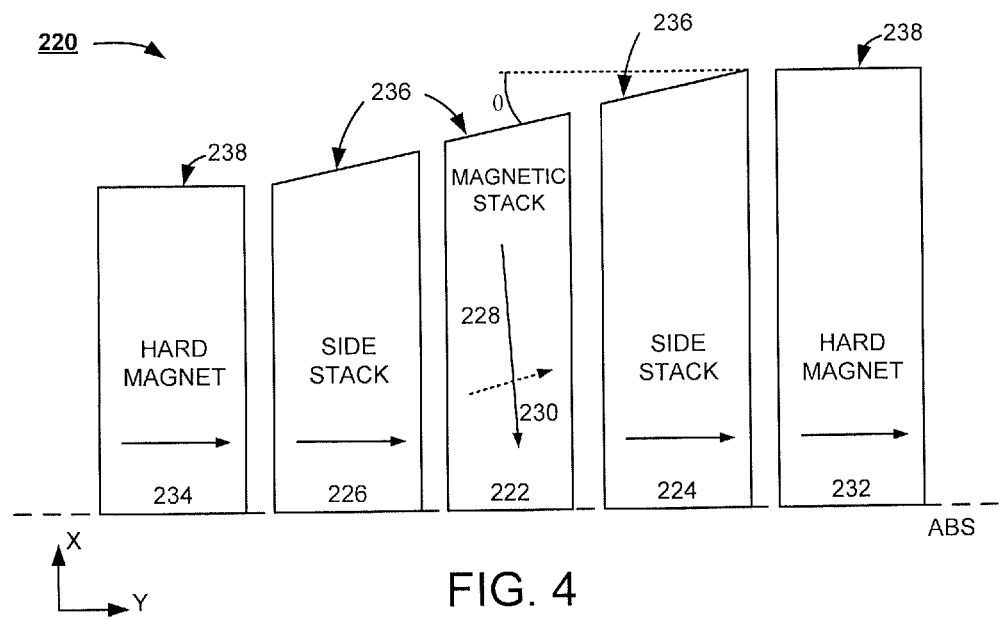
FIG. 4 displays a top view of a reading portion of a magnetic element constructed and operated in accordance with various embodiments of the present invention.

In another example of reading element configurations, FIG. 4 displays atop view of an embodiment of a reading portion 220 of a magnetic reading element as constructed and operated in accordance with various embodiments of the present invention. The central magnetic stack 222 is laterally disposed between first and second side stacks 224 and 226 that each produces a biasing magnetization that alters the stack magnetizations 228 and 230. The biasing characteristics of the side stacks 224 and 226 are aided by being disposed between hard magnets 232 and 234. The configuration of the hard magnets 232 and 234 can allow the side stacks 224 and 226 to have a reduced size and shape due to the reduced need to produce the entire biasing field experienced by the magnetic stack 222. It should be noted, however, that the side stacks 224 and 226 can individually or collectively be omitted from the reading portion 220 or modified in an unlimited manner with unique or common rear surface features 236 and 238.

The magnetic and side stacks 222, 224, and 226 are each configured with tapered rear surface features 236 that generally form individual trapezoidal shapes and share a predetermined non-parallel angularity (θ) compared to the ABS. The angularity of the rear surface features 236 result in the stacks 222, 224, and 226 having stripe heights that vary laterally for the entire element 220 and for each rear surface feature, similarly to the rear surface features 160 of FIG. 2B. The hard magnets 232 and 234 are each constructed with square rear surface features 238, similar to features 206 of FIG. 3, and differing stripe heights that conform to the most adjacent side stack. However, the stripe heights and thickness of the hard magnets 232 and 234 are not limited to the configuration shown in FIG. 4.

Figure 5:
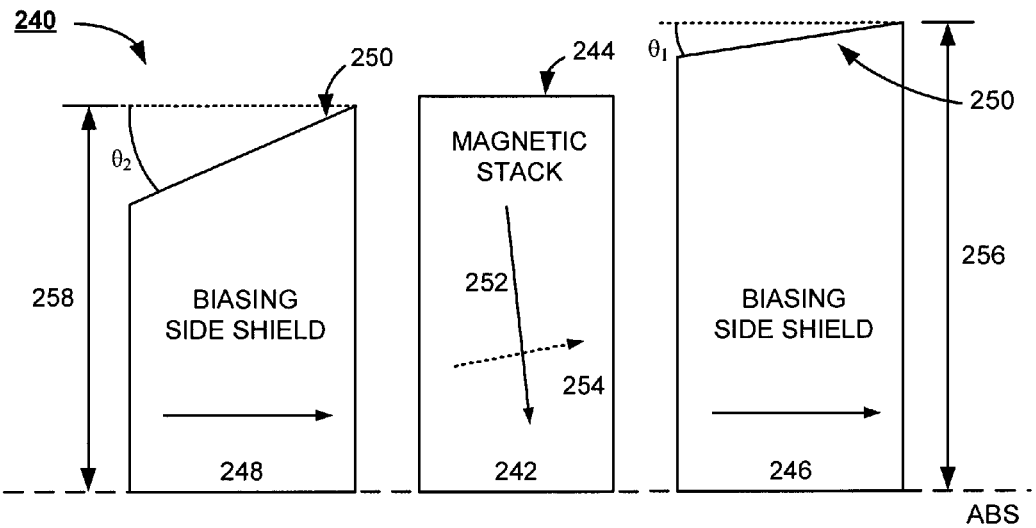
FIG. 5 illustrates a top view of an example of a reading portion of a magnetic element.

The unlimited nature of the present disclosure is further generally provided by the reading portion 240 of a magnetic element displayed in FIG. 5. The reading portion 240 is constructed with a magnetic stack 242 having a square rear surface feature 244 while the first and second side stacks 246 and 248 each have tapered rear surface features 250. While not limiting, the first side stack 246 has a first taper angle ($\theta_1$) that is less than a second taper angle ($\theta_2$) of the second side shield 248. The combination of square 244 and tapered 250 rear surface features can provide a multitude of possible configurations that each vary the quiescent and operational characteristics of the stack magnetizations 252 and 254.

With the inclusion of multiple taper angles ($\theta_1$ and $\theta_2$), the stripe heights 256 and 258 of the first and second side stacks 246 and 248 can substantially differ so that the longer first side shield contributes more to setting the stack magnetizations 252 and 254 than the second side stack 248. The use of multiple taper angles can further be configured to tilt towards the magnetic stack 242, as opposed to the both side stacks 246 and 248 tapering in a common lateral direction.

Regardless of the orientation of the rear surface features 244 and 250 and stripe heights 256 and 258, the stack magnetizations 252 and 254 can be precisely tuned to reduce magnetic noise and asymmetry due to the variety of configurations available for the rear surface features 244 and 250. Tuning of the reading portion 240 is further provided by the unlimited ability to implement side shields that dispel magnetic flux, hard magnets that provide a constant magnetic orientation, and biasing shields 246 and 248 that both shield magnetic flux while providing a magnetic orientation on the magnetic stack 242.

Figure 6:
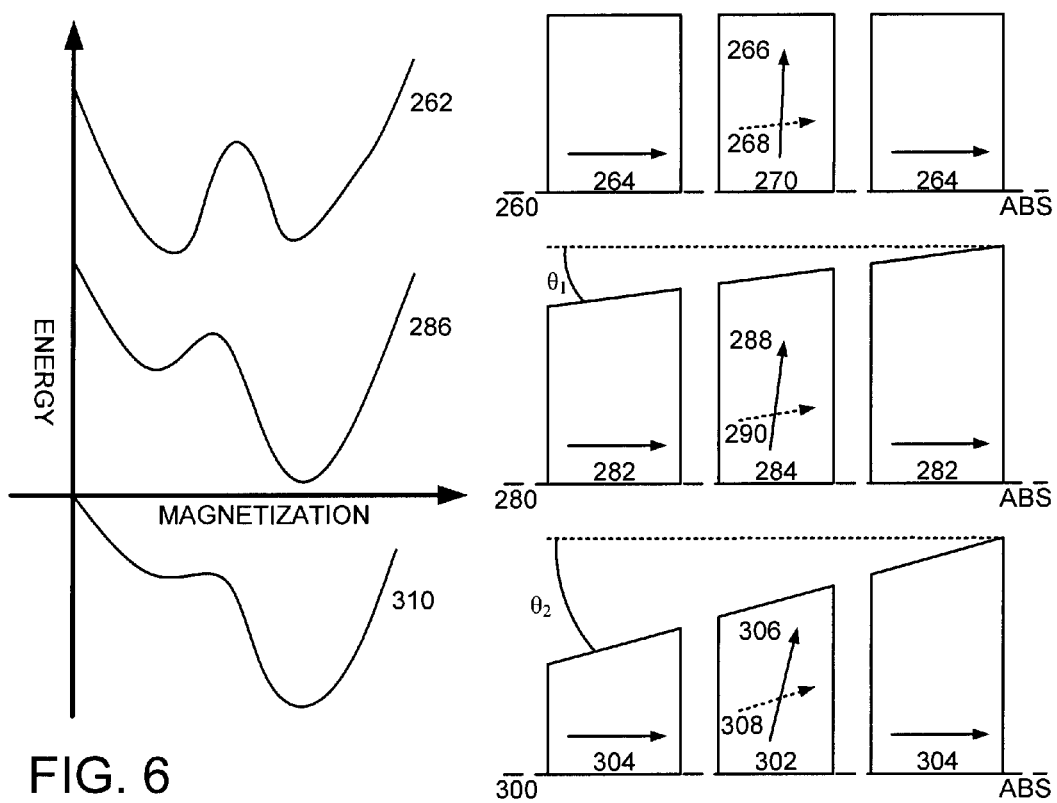
FIG. 6 displays various reading portions with examples of rear surface features and graphs corresponding to the magnetic performance of the reading portions.

FIG. 6 graphs various non-limiting effects of varying rear surface features on magnetic noise sensed by a magnetic stack. Reading element 260 is displayed with corresponding magnetic noise plot 262, which indicates how a square rear surface feature with no variation in stripe height causes a considerable amount of magnetic noise. The influence of the bias magnetizations of the side stacks 264 on the magnetizations 266 and 268 of the magnetic stack 270 further indicates how the stack magnetizations 266 and 268 are nearly orthogonal to the ABS.

In contrast with the reading element 260, reading element 280 constructs the side stacks 282 and magnetic stack 284 with tapered rear surface features that each shares a common taper angle ($\theta_1$) to form a common, but segmented, rear element line. Plotted noise line 286 illustrates that magnetic noise is reduced in comparison with reading element 260, but a measurable amount of noise is experienced due to the presence of energy barriers between different meta-stable energy states. With the taper angle ($\theta_1$), the stripe height of the side stacks 282 differ and induce the stack magnetizations 288 and 290 to tilt towards the longer side stack 282, which reduces variability with no loss in signal.

In reading element 300, the magnetic stack 302 and side stacks 304 each share tapered rear surface features with a taper angle ($\theta_2$) that is greater than the taper angle ($\theta_1$) of reading element 280. The large taper angle ($\theta_2$) contributes to staggered stripe heights from one lateral side to the other along the ABS. The larger size of one side shield due to longer stripe height results in the stack magnetizations 306 and 308 being closer together in angular orientation and less orthogonal with respect to the ABS. The performance of such stack magnetizations are plotted in line 310, which shows enhanced noise characteristics that can lead to improved data accuracy and high data bit density yield.

The various shield configurations of reading elements 260, 280, and 300, however, are not limited to the embodiments displayed and can be modified and combined, at will, to tune the performance characteristics of the magnetic stack. Such tuning is not limited to either square or tapered rear surface features as various other shapes and configurations can be used at will. The benefits of the rear surface features also do not require the presence of two lateral side shields to enhance performance as a single side shield can produce enhance magnetic performance.

Figure 7:
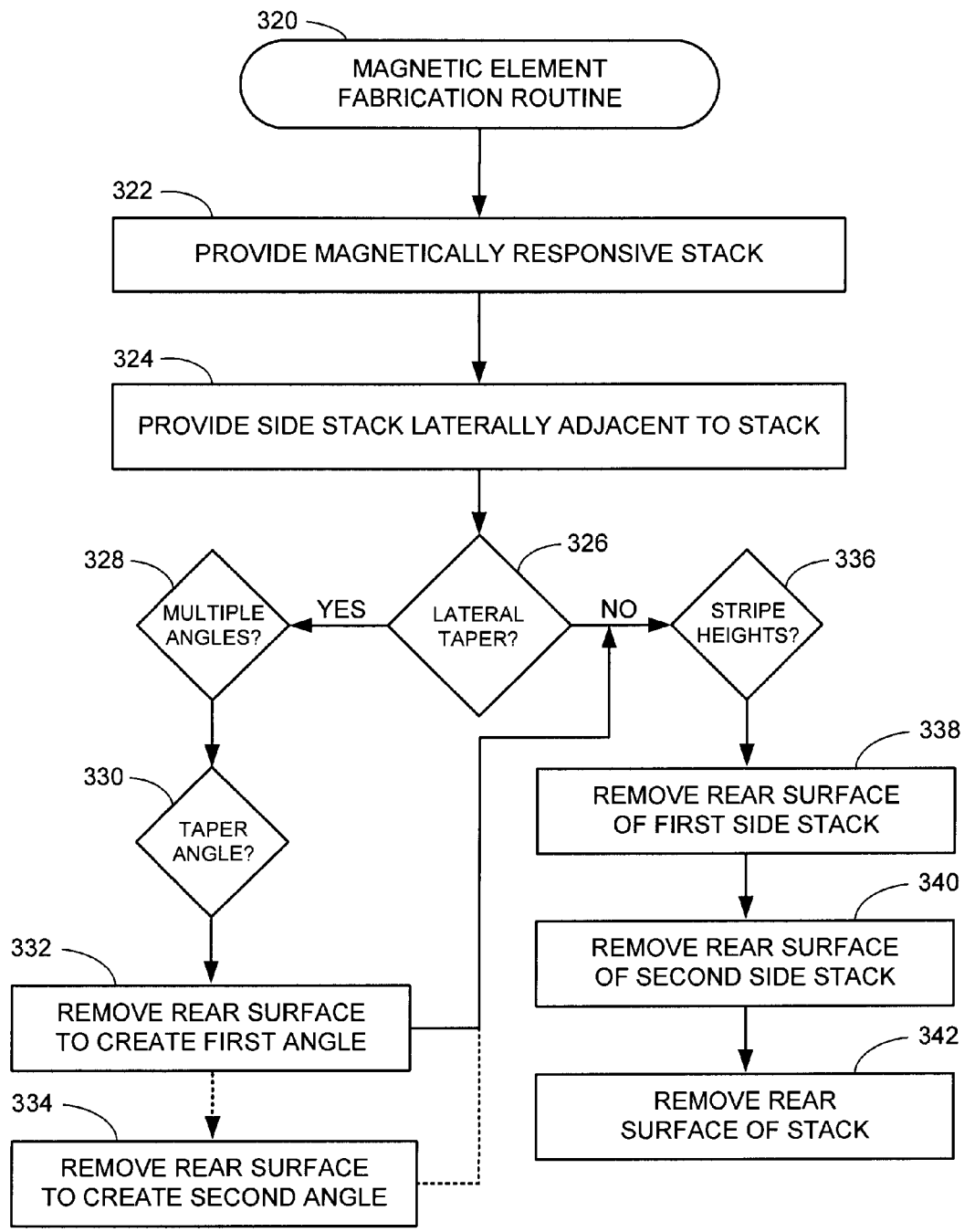
FIG. 7 provides a flowchart mapping a magnetic element fabrication routine conducted in accordance with various embodiments of the present invention.

FIG. 7 provides an embodiment of an element fabrication routine 320 conducted in accordance with various embodiments of the present invention. Routine 320 initially provides a magnetically responsive stack in step 322 that is capable of reading magnetic bits on an adjacent storage media across an ABS. As discussed above, the stack can be a lamination of ferromagnetic free layers or a combination of free and pinned layers that are sensitive to external programmed bits. At least one side stack that magnetically biases and possibly shields the magnetic stack is then positioned laterally adjacent the magnetic stack on the ABS in step 324.

A series of decisions follow step 324 as the stack and side shield(s) are evaluated to arrive at a configuration that provides enhanced performance, such as magnetic noise, asymmetry, and bias. Decision 326 determines if side shield(s) are to have tapered rear surface features. If tapered features are chosen in decision 326, the routine 320 proceeds to decision 328 where the number of taper angles is chosen. As shown in FIG. 4, side shields can have differing taper angles, which is determined in decision 328 and the particular angles are chosen in subsequent decision 330. With the design of the side shields resolved, step 332 and optional step 334 remove portions of the side shields and magnetic stack to conform to the design and create differing stripe heights for the shields and stack.

In the event that no lateral taper is chosen in decision 326, a square rear surface feature, as shown in FIGS. 3 and 5, is assumed to be needed. However, the assumption can be readily replaced with the fabrication of rear surface features of any shape and stripe height. Decision 336 determines the stripe heights for the side shields and magnetic stack to provide the operational performance. Steps 338 and 340 then modify one, or both, side shield to the predetermined stripe heights by removing rear surface portions. Finally in step 342, the magnetic stack has portions of its rear surface removed to achieve the designed stripe height.

Through the routine 320, a shielding and biasing configuration is determined and installed. However, the routine is not required or limited as the various decisions and steps can be omitted, changed, and added. For example, the decision of step 326 can be preceded or followed by additional decisions related to varying rear surface feature shapes. In another example, the various layers of the magnetic stack can be selectively installed with differing stripe heights and rear surface features.

In practice, configuring at least one rear surface feature on a side shield can enhance data bit reading in high linear bit density recordings that have reduced scale sizes for the reading element. The inclusion of at least one rear surface feature can alleviate the destabilization of the magnetic stack from side shield biasing while reducing magnetic noise and asymmetry. Thus, it can be appreciated that the configuration and material characteristics of the magnetic stack and side shields described in the present disclosure allows for enhanced data bit sensing through the ability to tune and control side shield biasing of the magnetic stack.

It is to be understood that even though numerous characteristics and configurations of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed. For example, the particular elements may vary depending on the particular application without departing from the spirit and scope of the present invention.

What is claimed is:

1. An apparatus comprising:
a magnetically responsive magnetic stack with a first stripe height distance from an air bearing surface (ABS) positioned laterally adjacent first and second side stacks that respectively extend second and third stripe height distances from the ABS, the second stripe height distance being greater than the third stripe height distance and the first stripe height distance being between the second and third stripe height distances in order to bias the magnetic stack to a predetermined magnetization.

2. The apparatus of claim 1, wherein the magnetic and side stacks each have a tapered rear surface that respectively reduces the first, second, and third stripe height distances along a lateral axis that runs parallel to the ABS.

3. The apparatus of claim 2, wherein the magnetic and side stacks continuously extend from a front surface on the ABS to the rear surface distal the ABS and opposite the front surface.

4. The apparatus of claim 2, wherein the magnetic stack has a first taper with a continuous first angle, the first side stack has a second taper with a continuous second angle, and the second side stack has a third taper with a continuous third angle, the first, second, and third angles measured with respect to the ABS.

5. The apparatus of claim 4, wherein the first, second, and third angles are coplanar.

6. The apparatus of claim 4, wherein at least two of the first, second, and third angles taper in opposite directions with respect to the ABS.

7. The apparatus of claim 1, wherein the magnetic stack has a first rear surface, the first side stack has a second rear surface, and the second side stack has a third rear surface, the first, second, and third rear surfaces each being parallel with the ABS.

8. The apparatus of claim 4, wherein the first, second, and third angles form a common straight line along an element rear surface.

9. The apparatus of claim 1, wherein the first, second, and third angles each tilt towards a common lateral direction.

10. The apparatus of claim 1, wherein the predetermined magnetization tilts towards the first side stack in response to the second stripe height distance being greater than the third stripe height distance.

11. The apparatus of claim 1, wherein the magnetic and side stacks are each configured as a trapezoid.

12. The apparatus of claim 1, wherein the magnetic stack and the first side stack have a first thickness at the ABS and the second side stack has a second thickness at the ABS that is less than the first thickness.

13. A magnetic element comprising:
a magnetically responsive magnetic stack comprised of dual ferromagnetic free layers separated by a non-magnetic spacer layer, the magnetic stack having a first stripe height from an air bearing surface (ABS);
a first side stack with a second stripe height positioned laterally adjacent the magnetic stack; and
a second side stack with a third stripe height positioned laterally adjacent the magnetic stack and opposite the first side stack, the second stripe height being greater than the third stripe height and the first stripe height being between the second and third stripe heights.

14. The magnetic element of claim 13, wherein the first and second side stacks are configured to bias the magnetic stack to a predetermined magnetization.

15. The magnetic element of claim 13, wherein the first and second side stacks each have tapered rear surface features and the magnetic stack has a square rear surface feature that is parallel to the ABS.

16. The magnetic element of claim 15, wherein the first side stack is tapered at a first angle and the second side stack is tapered at a different second angle.

17. The magnetic element of claim 13, wherein the second stripe height corresponds with a trapezoidal first side stack shape.

18. A method comprising disposing a magnetically responsive magnetic stack with a first stripe height laterally between first and second side stacks that respectively extend second and third stripe height distances from an air bearing surface (ABS), and configuring the second strip height distance to be greater than the third stripe height distance and the first stripe height to be between the second and third stripe height distances to bias the magnetic stack to a predetermined magnetization.

19. The method of claim 18, wherein the magnetic and side stacks each have a tapered rear surface feature with a common angle, the rear surface features being simultaneously formed from a single milling process.

\* \* \* \* \*